United States Patent
Jiang et al.

(10) Patent No.: US 10,946,430 B2
(45) Date of Patent: Mar. 16, 2021

(54) SCREEN STRETCHER DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Liang Jiang, Shenzhen (CN); Jinchuan Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 566 days.

(21) Appl. No.: 15/578,719

(22) PCT Filed: Nov. 9, 2017

(86) PCT No.: PCT/CN2017/110206
§ 371 (c)(1),
(2) Date: Dec. 1, 2017

(87) PCT Pub. No.: WO2019/071696
PCT Pub. Date: Apr. 18, 2019

(65) Prior Publication Data
US 2019/0105699 A1    Apr. 11, 2019

(30) Foreign Application Priority Data
Oct. 9, 2017    (CN) .................. 201710929886.1

(51) Int. Cl.
    *B21D 25/04*        (2006.01)
    *B21D 26/14*        (2006.01)
    (Continued)

(52) U.S. Cl.
    CPC ............ *B21D 25/04* (2013.01); *B05C 21/005* (2013.01); *B21D 26/14* (2013.01); *C23C 14/042* (2013.01);
    (Continued)

(58) Field of Classification Search
None
See application file for complete search history.

(56) References Cited

U.S. PATENT DOCUMENTS

| | | | | |
|---|---|---|---|---|
| 4,733,125 A | * | 3/1988 | Tokita | H01J 9/146 |
| | | | | 313/402 |
| 2004/0020435 A1 | * | 2/2004 | Tsuchiya | C23C 14/042 |
| | | | | 118/723 VE |

FOREIGN PATENT DOCUMENTS

| CN | 206204401 U | * | 5/2017 | ............ C23C 14/12 |
|---|---|---|---|---|
| CN | 206204401 U | * | 5/2017 | ........... C23C 14/042 |

(Continued)

*Primary Examiner* — Jethro M. Pence
(74) *Attorney, Agent, or Firm* — JMB Davis Ben-David

(57) ABSTRACT

A screen stretcher device is provided and has a tensioning mechanism, a first fixture and a second fixture. The first fixture is securely disposed at one end of a metal mask plate, and the second fixture is securely disposed at the other end of the metal mask plate. A horizontal plate is disposed above the metal mask plate. A measuring mechanism is configured to acquire location information of a pattern on the metal mask plate. A magnetic mechanism is disposed above the horizontal plate, and is configured to attract the metal mask plate such that the metal mask plate is deformed.

13 Claims, 2 Drawing Sheets

(51) Int. Cl.
*C23C 14/04* (2006.01)
*C23C 16/04* (2006.01)
*B05C 21/00* (2006.01)
H01L 51/00 (2006.01)
H01L 51/56 (2006.01)

(52) U.S. Cl.
CPC ........ *C23C 16/042* (2013.01); *H01L 51/0011* (2013.01); *H01L 51/56* (2013.01)

(56) References Cited

FOREIGN PATENT DOCUMENTS

| | | | | | |
|---|---|---|---|---|---|
| CN | 206282833 U | * | 6/2017 | ............. | H01L 21/68 |
| CN | 206282833 U | * | 6/2017 | ............. | H01L 21/68 |

* cited by examiner

SCREEN STRETCHER DEVICE

CROSS-REFERENCE TO RELATED APPLICATIONS

This is the U.S. National Stage of International Patent Application No. PCT/CN2017/110206, filed Nov. 9, 2017, which in turn claims the benefit of Chinese Patent Application No. 201710929886.1, filed Oct. 9, 2017.

FIELD OF INVENTION

The present invention relates to fields of display panel manufacture, especially to a screen stretcher device for manufacturing metal mask plates.

BACKGROUND OF INVENTION

Organic light-emitting diodes (OLEDs) have advantages such as self-light-emission, being all solid state, having high contrast, etc, and therefore have become the most potential new type of display devices recently. During manufacturing processes of the OLEDs, a precise metal mask for defining pixels (pixel regions) is required such that vaporized organic material may be deposited in the pixel regions. During a vapor deposition process, a metal mask plate tightly contacts a glass substrate by magnetic force. As such, quality of manufactured metal mask plate directly influences location precision of the vapor-deposited pixels.

A conventional metal mask plate manufacturing process employs a screen stretcher, which welds an exposed and etched metal mask plate onto a metal frame to acquire a metal mask plate for vapor deposition. During the manufacturing process, locations of pixel openings are captured by a charge-coupled device (CCD) detector. Through comparison of differences between actual locations and designed values, correction information of the screen stretcher is acquired and fed back to a tensioning mechanism to correct the locations. The abovementioned steps are repeated until the actual locations conform to the designed locations. After the locations of the pixels are corrected to be precisely determined, a laser head is used to weld and fasten the metal mask plate on the metal frame. However, during operation, the metal mask plate tightly contacts the glass substrate by magnetic force. In this process, the metal mask plate is deformed due to the magnetic force, which results in location deviation of the pixels, and causes defects of products such as color mixing, lack of color and mura (uneven screen brightness). The conventional manufacturing process of the metal mask plate is unable to correct such defects.

As described above, a metal mask plate manufactured by the conventional screen stretcher device is deformed to result in location deviation of pixels defined on a surface of the glass substrate and further to cause defects of color mixing, lack of color and mura on the display panel.

SUMMARY OF INVENTION

The present invention provides a screen stretcher device that is able to simulate deformation of a metal mask plate in use. By detecting metal pattern location information on a surface of the deformed metal mask plate, the metal mask plate is adjusted. Thus, the technologic issue that the metal mask plate manufactured by the conventional screen stretcher device is deformed to result in location deviation of pixels defined on a surface of the glass substrate and further to cause defects of color mixing, lack of color and mura on the display panel is solved.

To solve the above issues, the present invention provides technologic solutions as follows.

The present invention provides a screen stretcher device configured to manufacture a metal mask plate for vapor deposition. The screen stretcher device comprises:

a tensioning mechanism comprising a first fixture and a second fixture disposed opposite to each other, the first fixture securely disposed at a first end of the metal mask plate, and the second fixture securely disposed at a second end of the metal mask plate opposite to the first end;

a horizontal plate being liftable and disposed above the metal mask plate, wherein the horizontal plate is a metal plate, and a side of the horizontal plate facing the metal mask plate is a black oxidized surface;

a measuring mechanism disposed in a working region of the screen stretcher device, and the measuring mechanism configured to move three-dimensionally in the working region to acquire location information of a pattern on the metal mask plate; and a magnetic mechanism being liftable and disposed above the horizontal plate, and configured to attract the metal mask plate to deform the metal mask plate.

According to a preferred embodiment of the present invention, the measuring mechanism comprises an upper pattern acquisition device and a lower pattern acquisition device. The upper pattern acquisition device is disposed above the metal mask plate, and the lower pattern acquisition device is disposed below the metal mask plate.

According to a preferred embodiment of the present invention, the horizontal plate is metal plate, and a side of the horizontal plate facing the metal mask plate is a black oxidized surface.

According to a preferred embodiment of the present invention, a surface roughness of the black oxidized surface of the horizontal plate is less than or equal to 1 um.

According to a preferred embodiment of the present invention, the screen stretcher device further comprises a lifting device, the lifting device comprises a base and a lifting arm disposed on the base. The lifting arm is disposed perpendicular to the base.

According to a preferred embodiment of the present invention, the magnetic mechanism comprises a magnetic plate, and an end of the magnetic plate is liftable and is securely disposed on the lifting arm.

According to a preferred embodiment of the present invention, an end of the horizontal plate is liftable and is securely disposed on the lifting arm, and the horizontal plate is disposed parallel to the magnetic plate.

According to a preferred embodiment of the present invention, a metal edge frame is dispose below the metal mask plate.

According to a preferred embodiment of the present invention, the screen stretcher device further comprises welding mechanism, the welding mechanism comprises a movable device, and a laser welding gun is disposed at an end of the movable device.

According to a preferred embodiment of the present invention, the tensioning mechanism further comprises a third fixture and a fourth fixture disposed opposite to each other. The third fixture is securely disposed at a third end of the metal mask plate, the fourth fixture is securely disposed at a fourth end of the metal mask plate, and the fourth end is located opposite to the third end.

The present invention also provides a screen stretcher device configured to manufacture a metal mask plate for vapor deposition. The screen stretcher device comprises:

a tensioning mechanism comprising a first fixture and a second fixture disposed opposite to each other, the first fixture securely disposed at a first end of the metal mask plate, and the second fixture securely disposed at a second end of the metal mask plate opposite to the first end;

a horizontal plate being liftable and disposed above the metal mask plate;

a measuring mechanism disposed in a working region of the screen stretcher device, and the measuring mechanism configured to move three-dimensionally in the working region to acquire location information of a pattern on the metal mask plate; and a magnetic mechanism being liftable and disposed above the horizontal plate, and configure to attract the metal mask plate to deform the metal mask plate.

According to a preferred embodiment of the present invention, the measuring mechanism comprises an upper pattern acquisition device and a lower pattern acquisition device. The upper pattern acquisition device is located above the metal mask plate, and the lower pattern acquisition device is located below the metal mask plate.

According to a preferred embodiment of the present invention, a surface roughness of the black oxidized surface of the horizontal plate is less than or equal to 1 um.

According to a preferred embodiment of the present invention, the screen stretcher device further comprises a lifting device. The lifting device comprises a base and a lifting arm disposed on the base, and the lifting arm is disposed perpendicular to the base.

According to a preferred embodiment of the present invention, the magnetic mechanism comprises a magnetic plate. An end of the magnetic plate is liftable and is securely disposed on the lifting arm.

According to a preferred embodiment of the present invention, an end of the horizontal plate is liftable and is securely disposed on the lifting arm, and the horizontal plate is disposed parallel to the magnetic plate.

According to a preferred embodiment of the present invention, a metal edge frame is disposed below the metal mask plate.

According to a preferred embodiment of the present invention, the screen stretcher device further comprises a welding mechanism, and the welding mechanism comprises a movable device. A laser welding gun is disposed at an end of the movable device.

According to a preferred embodiment of the present invention, the tensioning mechanism further comprises a third fixture and a fourth fixture disposed opposite to each other, the third fixture is securely disposed at a third end of the metal mask plate, the fourth fixture is securely disposed at a fourth end of the metal mask plate, and the fourth end is located opposite to the third end.

According to the above objective of the present invention, a metal mask plate manufacturing method employing the above screen stretcher device is provided, the metal mask plate manufacturing method comprises:

step S10, using the first and second fixtures of the tensioning mechanism to fasten the metal mask plate;

step S20, providing an upper pattern acquisition device that is disposed above the metal mask plate, and using the upper pattern acquisition device to detect the metal mask plate to acquire first location information;

step S30, stretching and adjusting the metal mask plate by the tensioning mechanism according to the first location information;

step S40, providing the horizontal plate, wherein the horizontal plate is disposed above the metal mask plate;

step S50, providing a magnetic plate, wherein the magnetic plate is disposed above the horizontal plate, and the magnetic plate attracts the metal mask plate such that the metal mask plate is deformed and fitted on a side of the horizontal plate;

step S60, providing a lower pattern acquisition device that is disposed below the metal mask plate, and using the lower pattern acquisition device to detect the deformed metal mask plate to acquire second location information;

step S70, secondly stretching and adjusting the metal mask plate by the tensioning mechanism according to the second location information.

Advantageous effects of the present invention are as follows. In comparison with a conventional screen stretcher device, when manufacturing a metal mask plate, the screen stretcher device provided by the present invention simulates deformation of the metal mask plate in use, adjusts the metal mask plate by detecting metal pattern location information on a surface of the deformed metal mask plate, and then acquires the metal mask plate with high precision. The technologic issue that the metal mask plate manufactured by the conventional screen stretcher device is deformed to result in location deviation of pixels defined on a surface of the glass substrate and further to cause defects of color mixing, lack of color and mura on the display panel is solved.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
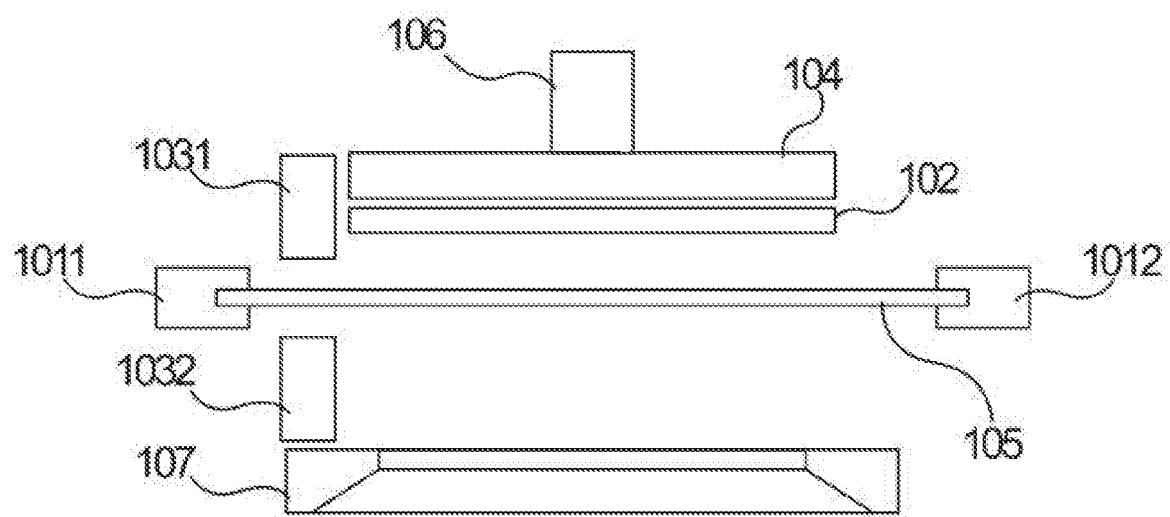
FIG. 1 is a schematic structural view of a screen stretcher device in accordance with the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention aimed at the technical issue that the metal mask plate manufactured by the conventional screen stretcher device is deformed to result in location deviation of pixels defined on a surface of the glass substrate and further to cause defects of color mixing, lack of color and mura on the display panel. The present invention can solve the abovementioned defects.

With reference to FIG. 1, a screen stretcher device in accordance with the present invention includes a tensioning mechanism, a horizontal plate 102, a measuring mechanism and a magnetic mechanism.

The tensioning mechanism is configured to stretch a rectangular metal mask plate 105, and to adjust a location of a metal pattern on a surface of metal mask plate 105 by stretching. The tensioning mechanism comprises a first fixture 1011 and a second fixture 1012. The first fixture 1011 is securely disposed at a first end of the metal mask plate 105. The second fixture 1012 is securely disposed at a second end of the metal mask plate 105 opposite to the first end. For example, the tensioning mechanism further includes a third fixture and fourth fixture disposed opposite to each other. The third fixture is securely disposed at a third end of the metal mask plate 105. The fourth fixture is securely disposed at a fourth end of the metal mask plate 105. The fourth end is located opposite to the third end. The first fixture 1011, the second fixture 1012, the third fixture and the fourth fixture may be used to stretch the metal mask plate 105 in four directions to adjust the metal mask plate 105.

The horizontal plate 102 is configured to simulate a glass substrate of a vapor deposition process. The horizontal plate 102 is a metal plate with a flat surface.

The measuring mechanism is disposed in a working region of the screen stretcher device. The measuring mechanism is able to move three-dimensionally in the working region, and is configured to acquire location information of a pattern on the metal mask plate 105. The measuring mechanism at least includes an upper pattern acquisition device 1031 and a lower pattern acquisition device 1032. The upper pattern acquisition device 1031 is located above the metal mask plate 105, and the lower pattern acquisition device 1032 is located below the metal mask plate 105.

The magnetic mechanism is liftable and disposed above the horizontal plate 102, is configured to attract the metal mask plate 105 such that some regions of the metal mask plate 105 are deformed and are fitted on the horizontal plate 102.

When the screen stretcher device is operating, the horizontal plate 102 and the magnetic mechanism are greater distances from the metal mask plate 105. During this time, the metal mask plate 105 is flat, the upper pattern acquisition device 1031 moves over the metal mask plate 105, and detects and compares the metal pattern on a surface of the metal mask plate 105 to acquire first location information. The tensioning mechanism stretches and adjusts the metal mask plate 105 according to the first location information. Then, the upper pattern acquisition device 1031 move away from the metal mask plate 105, the horizontal plate 102 and the magnetic mechanism are lowered close to the metal mask plate 105, and the magnetic mechanism attracts the metal mask plate 105 such that some regions of the metal mask plate 105 are deformed and are fitted on a surface of the horizontal plate 102. At the meantime, the lower pattern acquisition device 1032 detects and compares the metal pattern on the surface of the metal mask plate 105 to acquire second location information, and then the magnetic mechanism moves away from the metal mask plate 105 such that the metal mask plate 105 is recovered to be flat. The tensioning mechanism secondly stretches and adjusts the metal mask plate 105 according to the second location information to acquire a metal mask plate 105 with high precision satisfying vapor deposition requirements.

Aside of the horizontal plate 102 facing the metal mask plate 105 is blackened to form a black oxidized surface to prevent reflection of a surface of the horizontal plate 102 that affects precision of the location information of the pattern of the metal mask plate 105 acquired by the lower pattern acquisition device 1032.

A surface roughness of the black oxidized surface is less than or equal to 1 um, which improves fitness of the deformed metal mask plate 105 onto the black oxidized surface and further allows the lower pattern acquisition device 1032 to detect and acquire more precise location information of the metal mask plate 105.

The magnetic mechanism includes a magnetic plate 104. The magnetic plate 104 is disposed parallel to the horizontal plate 102.

The screen stretcher device further includes a lifting device. The lifting device includes a base and a lifting arm 106 disposed on the base. The lifting arm 106 is disposed perpendicular to the base. a slide track is disposed on a side portion of the lifting arm 106. A first fastener and a second fastener are disposed slidably on the slide track. The first fastener is connected securely to an end of the magnetic plate 104. The second fastener is connected securely to an end of the horizontal plate 102. The first fastener and the second fastener may move close to each other or move away from each other, and therefore adjust to a distance between the magnetic plate 104 and the horizontal plate 102.

A metal edge frame 107 is disposed below the metal mask plate 105.

The screen stretcher device further includes a welding mechanism. The welding mechanism includes a movable device. A laser welding gun is disposed on an end of the movable device. After the metal mask plate 105 is completely adjusted, the tensioning mechanism moves away from the metal mask plate 105 such that the metal mask plate 105 falls into a corresponding position of the metal edge frame 107, and the laser welding gun welts the metal mask plate 105 in the metal edge frame 107.

Figure 2:
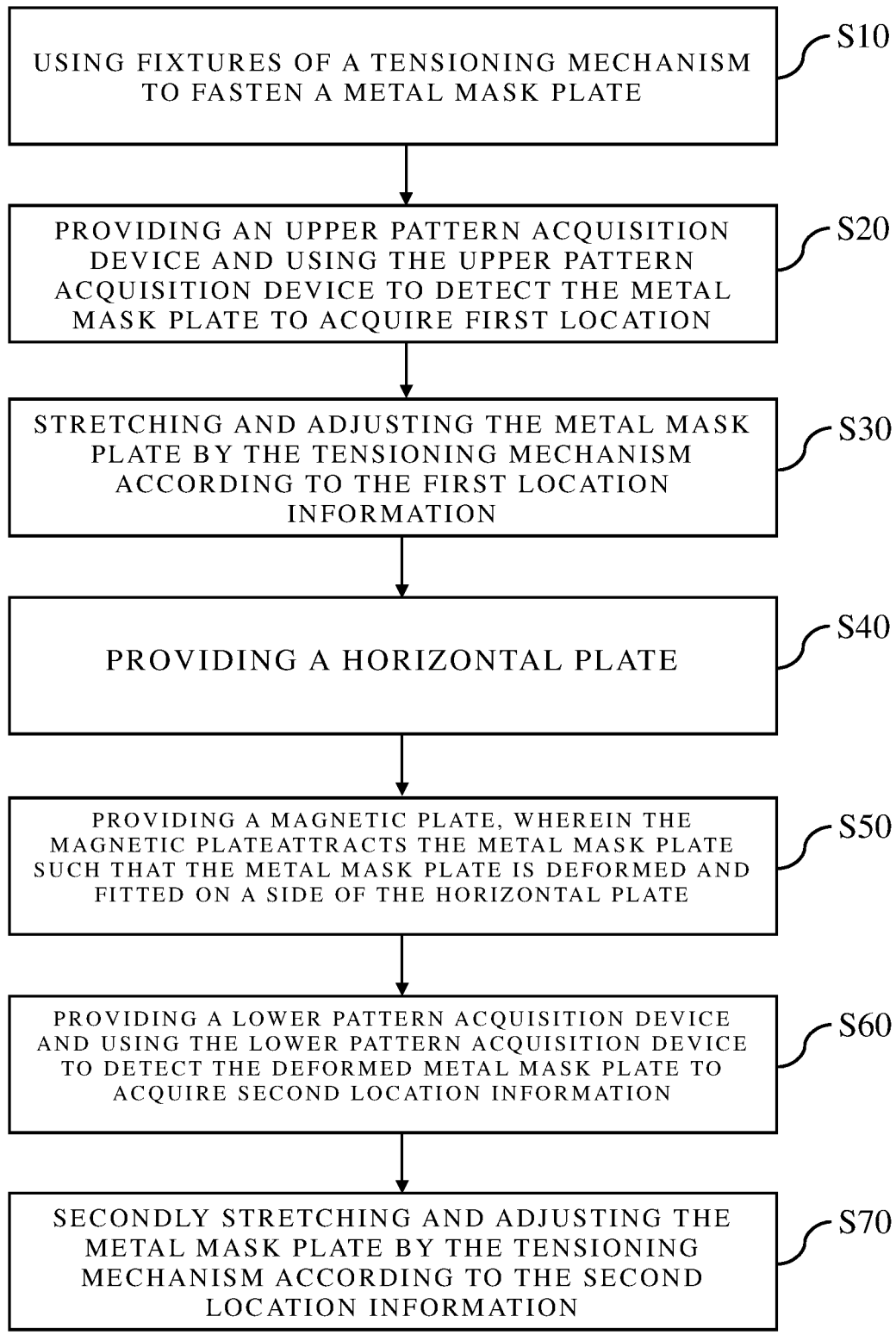
FIG. 2 is a flowchart of a metal mask plate manufacturing method employing the screen stretcher device in accordance with the present invention.

With reference to FIG. 2, according to the objective of the present invention, a metal mask plate manufacturing method employing the above screen stretcher device is provided. The metal mask plate manufacturing method includes:

step S10, using the first and second fixtures of the tensioning mechanism to fasten the metal mask plate;

step S20, providing an upper pattern acquisition device and using the upper pattern acquisition device to detect the metal mask plate to acquire first location information, wherein the upper pattern acquisition device is disposed above the metal mask plate;

step S30, stretching and adjusting the metal mask plate by the tensioning mechanism according to the first location information;

step S40, providing the horizontal plate, wherein the horizontal plate is disposed above the metal mask plate;

step S50, providing a magnetic plate, wherein the magnetic plate attracts the metal mask plate such that the metal mask plate is deformed and fitted on a side of the horizontal plate, and the magnetic plate is disposed above the horizontal plate;

step S60, providing a lower pattern acquisition device and using the lower pattern acquisition device to detect the deformed metal mask plate to acquire second location information, wherein the lower pattern acquisition device is disposed below the metal mask plate; and step S70, secondly stretching and adjusting the metal mask plate by the tensioning mechanism according to the second location information.

According to a preferred embodiment of the present invention, the metal mask plate manufacturing method further includes:

step S80 comprising welding the secondly stretched and adjusted metal mask plate onto a metal frame by a laser welding gun.

Advantageous effects of the present invention are as follows. In comparison with a conventional screen stretcher device, when manufacturing a metal mask plate, the screen stretcher device provided by the present invention simulates deformation of the metal mask plate in use, adjusts the metal mask plate by detecting metal pattern location information on a surface of the deformed metal mask plate, and then acquires the metal mask plate with high precision. The technologic issue that the metal mask plate manufactured by the conventional screen stretcher device is deformed to result in location deviation of pixels defined on a surface of the glass substrate and further to cause defects of color mixing, lack of color and mura on the display panel is solved.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

The invention claimed is:

1. A screen stretcher device configured to manufacture a metal mask plate for vapor deposition, wherein the screen stretcher device comprises:
    a tensioning mechanism comprising a first fixture and a second fixture disposed opposite to each other, the first fixture securely disposed at a first end of the metal mask plate, and the second fixture securely disposed at a second end of the metal mask plate opposite to the first end;
    a horizontal plate being liftable and disposed above the metal mask plate, wherein the horizontal plate is a metal plate, and a side of the horizontal plate facing the metal mask plate is a black oxidized surface;
    a measuring mechanism disposed in a working region of the screen stretcher device, the measuring mechanism configured to move three-dimensionally in the working region to acquire location information of a pattern on the metal mask plate; and
    a magnetic mechanism being liftable and disposed above the horizontal plate, and configured to attract the metal mask plate to deform the metal mask plate;
    wherein the measuring mechanism comprises an upper pattern acquisition device and a lower pattern acquisition device, the upper pattern acquisition device is located above the metal mask plate and is separate from the metal mask plate, and the lower pattern acquisition device is disposed below the metal mask plate and is separate from the metal mask plate.

2. The screen stretcher device as claimed in claim 1, wherein a surface roughness of the black oxidized surface of the horizontal plate is less than or equal to 1 um.

3. The screen stretcher device as claimed in claim 1, wherein the screen stretcher device further comprises a lifting device, the lifting device further comprises a base and a lifting arm disposed on the base, and the lifting arm is disposed perpendicular to the base.

4. The screen stretcher device as claimed in claim 3, wherein the magnetic mechanism comprises a magnetic plate, and an end of the magnetic plate is liftable and is securely disposed on the lifting arm.

5. The screen stretcher device as claimed in claim 4, wherein an end of the horizontal plate is liftable and is securely disposed on the lifting arm, and the horizontal plate is disposed parallel to the magnetic plate.

6. The screen stretcher device as claimed in claim 1, wherein a metal edge frame is disposed below the metal mask plate.

7. The screen stretcher device as claimed in claim 6, wherein the screen stretcher device further comprises a welding mechanism, the welding mechanism comprises a movable device, and a laser welding gun is disposed at an end of the movable device.

8. A screen stretcher device for manufacturing a metal mask plate for vapor deposition, wherein the screen stretcher device comprises:
    a tensioning mechanism comprising a first fixture and a second fixture disposed opposite to each other, the first fixture securely disposed at a first end of the metal mask plate, and the second fixture securely disposed at a second end of the metal mask plate opposite to the first end;
    a horizontal plate being liftable and disposed above the metal mask plate;
    a measuring mechanism disposed in a working region of the screen stretcher device, and the measuring mechanism configured to move three-dimensionally in the working region to acquire location information of an pattern on the metal mask plate; and
    a magnetic mechanism being liftable and disposed above the horizontal plate, and configure to attract the metal mask plate to deform the metal mask plate;
    wherein the measuring mechanism comprises an upper pattern acquisition device and a lower pattern acquisition device, the upper pattern acquisition device is located above the metal mask plate and is separate from the metal mask plate, and the lower pattern acquisition device is located below the metal mask plate and is separate from the metal mask plate.

9. The screen stretcher device as claimed in claim 8, wherein the screen stretcher device further comprises a lifting device, the lifting device comprises a base and a lifting arm disposed on the base, and the lifting arm is disposed perpendicular to the base.

10. The screen stretcher device as claimed in claim 9, wherein the magnetic mechanism comprises a magnetic plate, and an end of the magnetic plate is liftable and is securely disposed on the lifting arm.

11. The screen stretcher device as claimed in claim 10, wherein an end of the horizontal plate is liftable and is securely disposed on the lifting arm, and the horizontal plate is disposed parallel to the magnetic plate.

12. The screen stretcher device as claimed in claim 8, wherein a metal edge frame is disposed below the metal mask plate.

13. The screen stretcher device as claimed in claim 12, wherein the screen stretcher device further comprises a welding mechanism, the welding mechanism comprises a movable device, and a laser welding gun is disposed at an end of the movable device.

* * * * *